(12) United States Patent
Van Gastel

(10) Patent No.: US 9,197,440 B2
(45) Date of Patent: Nov. 24, 2015

(54) METHOD FOR A FAST SENSOR SYSTEM

(75) Inventor: Peter Van Gastel, Solingen (DE)

(73) Assignee: HUF HULSBECK & FURST GMBH & CO. KG (DE)

( * ) Notice: Subject to any disclaimer, the term of this patent is extended or adjusted under 35 U.S.C. 154(b) by 119 days.

(21) Appl. No.: 13/576,457

(22) PCT Filed: Feb. 1, 2011

(86) PCT No.: PCT/EP2011/051361
§ 371 (c)(1),
(2), (4) Date: Sep. 4, 2012

(87) PCT Pub. No.: WO2011/092340
PCT Pub. Date: Aug. 4, 2011

(65) Prior Publication Data
US 2013/0006470 A1  Jan. 3, 2013

(30) Foreign Application Priority Data

Feb. 1, 2010   (DE) .......................... 10 2010 006 621

(51) Int. Cl.
*H04L 12/403* (2006.01)
*H03K 17/00* (2006.01)
(Continued)

(52) U.S. Cl.
CPC ............ *H04L 12/4035* (2013.01); *H03K 17/00* (2013.01); *H03K 17/955* (2013.01);
(Continued)

(58) Field of Classification Search
CPC ................. B01Q 1/00; H04L 12/4035; H04L 2012/40273; H04L 2012/40215; H04L 2012/40228; H03K 17/955; H03K 2217/94052
See application file for complete search history.

(56) References Cited

U.S. PATENT DOCUMENTS

| 2004/0189452 A1* | 9/2004 | Li ................................. 340/435 |
| 2007/0094385 A1* | 4/2007 | Gronauer et al. ............ 709/224 |
| 2009/0180497 A1 | 7/2009 | Bidenbach et al. |

FOREIGN PATENT DOCUMENTS

| AT | 500441 A2 | 12/2005 |
| CN | 101051806 A | 10/2007 |

(Continued)

OTHER PUBLICATIONS

International Preliminary Report on Patentability; International Application No. PCT/EP2011/051361; International Filing Date Feb. 1, 2011; Mail Date Aug. 16, 2012.
(Continued)

*Primary Examiner* — John Q Nguyen
*Assistant Examiner* — Michael Kerrigan
(74) *Attorney, Agent, or Firm* — Cantor Colburn LLP

(57) ABSTRACT

The invention relates to a method for controlling a sensor system (10) for a vehicle (100), comprising at least one or two sensors (11, 12) which have respective detection regions (11*b*, 12*b*) and metrologically detect changes in these detection regions (11*b*, 12*b*) and emit them as measured signals (11*a*, 12*a*), a control unit (15), especially in the form of a microprocessing unit which is connected to the sensors (11, 12), the control unit (15) evaluating the measured signals (11*a*, 12*a*) and generating at least one control signal (16) based thereon, at least one memory (18) in which at least the last control signal (16) is stored, and an interface (19) via which the control unit (15) forwards at least the last control signal to an external control module (21). At least one measured signal (11*a*, 12*a*) of a sensor (11, 12) is detected by the control unit (15) in a number of measurement steps (11.1-4, 12.1-4) and the control unit (15) transmits at least the last control signal (16) to the external control module (21) via the interface (19) between the individual measurement steps (11.1-4, 12.1-4).

13 Claims, 5 Drawing Sheets

(51) Int. Cl.
*H03K 17/955* (2006.01)
*H04L 12/40* (2006.01)

(52) U.S. Cl.
CPC .............. *H03K2217/94052* (2013.01); *H04L 2012/40215* (2013.01); *H04L 2012/40228* (2013.01); *H04L 2012/40273* (2013.01)

(56) References Cited

FOREIGN PATENT DOCUMENTS

| | | |
|---|---|---|
| DE | 10310622 A1 | 9/2004 |
| DE | 10315751 A1 | 10/2004 |
| EP | 1781061 A2 | 5/2007 |
| EP | 2079176 A1 | 7/2009 |

OTHER PUBLICATIONS

German Search Report; German Application No. 10 2010 006 621.4.
International Search Report; International Application No. PCT/EP2011/051361; International Filing Date Feb. 1, 2011; Mail Date May 11, 2011.
Benjamin Benz, "Sensitive Souls—Microcontroller Programming: Timer, Sensors and Rotary Encoders" C'T magazine, pp. 1-9, Article URL: http://www.heise.de/ct/artkel/Sensibelchen-289608.html.
Chinese Office Action issued Jul. 21, 2014 re: Chinese Application No. 2011800181177; citing: US 2009/0180497 A1, CN 101051806 A, EP 1781061 A2 and DE 10310622 A1.

* cited by examiner

METHOD FOR A FAST SENSOR SYSTEM

TECHNICAL FIELD

The present invention relates to a method for the control of a sensor system for a motor vehicle. Such a sensor system has at least two sensors which each comprise detection areas, detect changes in these detection areas using measuring, and relay measurement signals. In addition, the sensor system contains a control device, particularly in the form of a microprocessor which is connected to the sensors, wherein the control device evaluates each measurement signal and generates at least one control signal therefrom. In addition, the sensor system has at least one storage device in which at least the most recent control signal is saved. An interface is also included in the sensor system, wherein the control device uses the same to relay the most recent control signal to an external control module.

BRIEF DESCRIPTION OF RELATED ART

Sensor systems of this type in a vehicle, particularly a motor vehicle, are frequently connected to an external control module in a communication system. These communication systems generally have a serial data transfer. In this case, a so-called local interconnect network (LIN bus) or a control area network (CAN bus) can be included in the vehicle. One problem with these communication systems is that they query the individual communication subscribers (in this case: sensor systems) on their status at chronologically arbitrary points, but only allow the subscribers a short period of time to answer with the answer signal. If the subscriber does not answer in time, an error message can be generated as a result, the same displaying to the external control module that the subscriber in question is producing errors or is defective. In any case, individual subscribers, such as the sensor system named above, for example, require sufficient time to be able to carry out a precise measurement. If the external control module requests an answer signal during this time, however, a time delay results which leads to an error or a failure because the sensor systems of this type cannot interrupt the measurement in progress.

BRIEF SUMMARY

As such, the problem addressed by the present invention is that of providing a method for the control of a sensor system, as well as a corresponding sensor system, with high operational reliability. Queries of an external control module should be answered in a short time in order to prevent potential error messages.

In the method according to the invention, at least one measurement signal of a sensor is detected by the control device in multiple measurement steps, and the control device transmits at least the most recent control signal between the individual measurement steps to the external control module via the interface. As a result, a measurement signal of a sensor is not detected by the control device in complete form, because the time is not sufficient for this to happen. Particularly, if the external control module should request an answer signal during the process by means of a request signal, then the control device is not able to answer this request signal of the external control module by means of an answer signal. The control device can particularly only detect a measurement signal of a sensor at the same time. As such, the control device is not able to simultaneously query multiple actuators, particularly in the form of the sensors or the interface or the like, and/or to detect the corresponding signal. By means of the division of the complete measurement signal of a sensor according to the invention into multiple smaller measurement steps, the duration of the individual measurement step is reduced, such that the control device is free for a new action after a measurement step is carried out. As such, it is ensured that the control device can also react sufficiently quickly to a request signal of the external control module, and [the control device] relays a corresponding answer signal via the interface to the external control module. This answer signal can comprise at least the most recent stored control signal which is saved in the storage device. As a result, it is possible to reliably prevent error messages and answers not replied to the external control module by means of the division of the time-consuming measurement signal detection. In this way, it is possible to significantly increase the operational reliability of the sensor system. The method according to the invention is also possible with one sensor system with only one sensor, and therefore is not limited to two or more sensors. Of course, the measurement signal of the single sensor must likewise be divided into multiple measurement steps.

During the period of time between the ending of a previous measurement step and the start of the following measurement step, the control device can regularly query the interface for a request signal. If this request signal is not present, the control device detects the following measurement step in order to receive a complete measurement signal from at least one sensor.

Likewise, each measurement signal of the sensors can be divided into single measurement steps which are detected by the control device. This division is particularly necessary in cases when the detection of the measurement signal is particularly time-consuming. However, if a sensor of the sensor system is able to provide a complete measurement signal to the control device in a short time, then such a division is not necessarily required. As such, in the present method, a decision can be made for each individual sensor as to the extent to which its measurement signal can and/or must be divided into individual measurement steps.

Moreover, individual measurement steps of each sensor can always be detected in a pre-defined sequence by the control device, such that the control device queries the sensors in sequence. As such, it is possible to simply adapt the sensor system to the widely varying sensors and applications in the vehicular field. However, in order to keep the storage requirement of the sensor system as low as possible, it is reasonable to first query the individual measurement steps for one measurement signal (of one sensor) in the sequence, until this signal is complete. The result of the measurement signal can then be temporarily saved in a storage device. Next, the control device can begin with the detection of the next measurement signal from a further sensor if there is no request signal from an external control module by that point.

In order to make it possible to undertake a precise detection of the complete measurement signal of a sensor, a measurement step (of the sensor) can be ended at a defined point in the measurement signal, and particularly the evaluation and/or detection of the measurement signal can be continued at this defined point with the following measurement step (of the sensor). As such, by means of the predefined interruption of the detection of the measurement signal at a defined point, it is possible to reliably prevent measurement errors during the detection of the measurement signal. In addition, the complete measurement signal of a sensor can therefore be divided into nearly any number of measurement steps, because the division only depends on where the defined points for interrupting the measurement signal are provided.

In order to ensure in all cases that the external control module always obtains an answer signal promptly, the time span for a measurement step can be smaller than a prespecified answer time span from the external control module. In this case, the control device can also check, after one and/or after each measurement step, whether a request signal of the external control module for an answer signal is present at the interface. Because the answer time span is always larger than the time span for the individual measurement step, the measurement step is therefore always ended prior to the closing of the answer time span. As such, the control device has sufficient time to query the interface for a requested answer signal and/or request signal.

In order to simplify the process flow in the method according to the invention to the greatest extent possible, it can be contemplated that the time spans of the measurement steps for all sensors are designed to be the same length. The time span of the measurement steps can be between 2 and 20 times smaller than the entire span of time required for the detection of a complete measurement signal, for example. However, in order that there are not too many measurement steps for one measurement signal, the time span should not be, for example, smaller than a fifth of the prespecified answer time span for the external control module. Otherwise, it will be difficult to detect the complete measurement signal in a reasonable time span, because the control device is too highly occupied to jump back and forth between the individual actuators. As a result of this jumping back and forth, a certain amount of time is lost and this adds up significantly with so much switching. This can have disadvantageous effects.

In the method according to the invention, the control device can also always only query and/or detect one actuator at any one time, particularly in the form of the sensors or of the interface. If one would like to query multiple sensors at the same time, then more microprocessors must be provided for the control device, and the price of the sensor system climbs significantly, and the process flow is then designed as overproportionately complicated. It is also difficult to re-program the control device with its microprocessors because not only must the vehicle specifics and/or the specifications of the external control module be taken into account, but the circuit structure of the sensor system must be as well. So that an exchange of data does not only take place unilaterally from the sensor system to the external control module via the interface, a bidirectional data exchange, particularly a serial data transmission, can occur via the interface with the external control module. Of course, a parallel data transmission can also be contemplated; however, more data lines are required for this purpose between the sensor system and the external control module. In the event that it is desirable to keep the wiring complexity in the vehicle as low as possible, it is reasonable to choose a serial data transmission.

In the method according to the invention, the interface of the control device can also relay the control signal as an answer signal to a communication system, particularly a serial communication system, particularly a so-called local interconnect network (LIN bus) or a controller area network (CAN bus). Both of these bus systems (LIN and CAN bus systems) have established themselves as a de facto standard in motor vehicle electronics. They are characterized by their simple and stable construction which enables a reliable transmission of data between the individual communication subscribers.

The present invention also relates to a sensor system for a vehicle. In this sensor system, the method according to the invention is executed in the control device. In this case, the control device can optionally have exactly one microprocessor. By means of the use of only one microprocessor, the sensor system can be deployed in a cost-effective but also highly flexible manner.

In the present sensor system, the sensors can be designed as touchless sensors which are particularly designed as capacitive sensors. With these capacitive sensors particularly, a rapid signal detection is not possible, or is only slightly possible, because the available capacitance of each capacitive sensor must be detected by measurement and relayed further as a measurement signal to the control device. It can likewise be contemplated that more than two sensors are used. These can include all capacitive sensors, wherein other sensor types can be contemplated, including piezo sensors, ultrasound sensors, switch elements, or the like, for example. In the context of the present invention, it does not matter whether the first sensor is attached to the vehicle below the second sensor, or not. As such, in the present embodiment, the first sensor can be interchanged with the second sensor.

The touchless sensors can be capacitive sensors or ultrasound sensors. Other proximity sensors can also likewise be used. Capacitive sensors can also be advantageously used, because these can be arranged behind a panel securely and in a protected manner, and need not be in direct contact with the environment of the vehicle.

By means of the present sensor system, it is possible to realize a virtual switch, for example for the actuation of a moving part, particularly in the form of a trunk hatch, a side door or sliding door in a motor vehicle.

Features and details which are described in association with the method according to the invention naturally apply in the context of the sensor system according to the invention, and vice versa.

BRIEF DESCRIPTION OF THE DRAWINGS

Further measures and features which improve the invention are described in greater detail below within the description of preferred embodiments of the invention, with reference to the figures, wherein.

DETAILED DESCRIPTION

Figure 1:
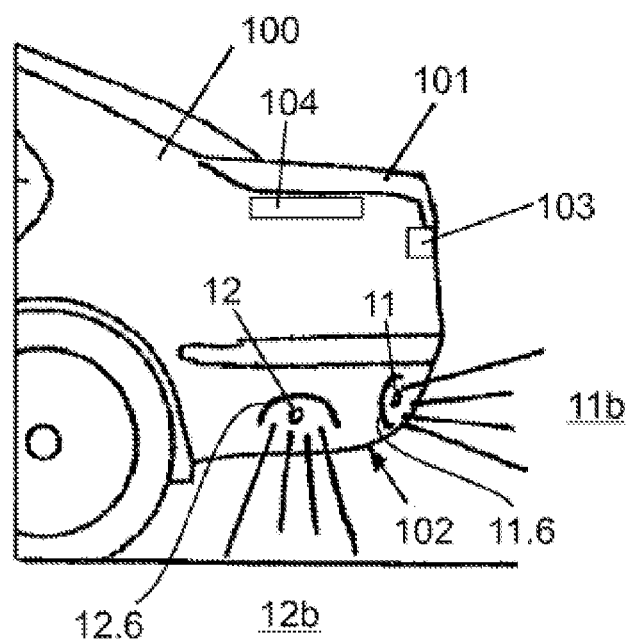
FIG. 1 shows an embodiment of the sensor system according to the invention for the touchless actuation of a trunk hatch on a vehicle.

FIG. 1 shows an embodiment of the sensor system 10 according to the invention, for example for the touchless actuation of a trunk hatch 101 as the moving part 101 of a vehicle 100, the same constituting a motor vehicle. The moving part 101 is held in the closed position and secured by an electromechanical lock 103. The sensor system 10 has a first sensor 11 for the detection of an object 80 in a first detection area 11b, and a second sensor 12 for the detection of an object 80 in a second detection area 12b. The sensors 11 and 12 are designed as capacitive sensors 11 and 12, and are only indicated schematically in the view. The detection area 11b covers the horizontal area behind the rear bumper 102 of the vehicle 100. In contrast, the detection area 12b covers the lower area beneath the rear bumper 102. As such, a first detection area 11b and a second detection area 12b are created which are geometrically separate from each other, for example, and do not include a common area on the external side of the rear bumper 16. Of course, in principle, the detection areas 11b, 12b can also particularly overlap. The detection areas 11b and 12b are indicated in the figures by rays, but these only indicate areas in which a change in the dielectric constant between the capacitive sensors 11 and 12 and describe the environment of the rear bumper 102. This change in the dielectric constant results in a change in the storable charge on the electrodes of the capacitive sensors 11 and 12, which can be detected by the sensor system 10. As such, the presence of an object 80, particularly the presence of body parts 80.1, 80.2 of a person, can be provided by the capacitive sensors 11 and 12 with minimal current consumption.

The directional means 11.6 and 12.6 extend behind the capacitive sensors 11 and 12, and are designed in the form of metallic shields 11.6, 12.6. These enclose the capacitive sensors 11, 12 as a curved or half-shell shape. The respective detection area 11b and 12b is prespecified by means of the shields 11.6 and 12.6, which thereby enable an improved separation of the detection areas 11b and 12b from each other. The metallic shields 11.6 and 12.6 have the same electrical potential as the corresponding capacitive sensors 11 and 12. As such, these are "active shields" in this case. Additional ground electrodes and/or ground shields can be included behind these "active shields", and the detection areas 11b, 12b of the capacitive sensors 11 and 12 can be directed in the opposite direction from the ground shields by means of the same—meaning away from the ground shields. The ground electrodes are typically connected directly to the vehicle ground via a ground contact.

Of course, a side door or sliding door 101 can also be actuated by the sensor system 10, instead of a trunk hatch 101, wherein the sensor system [10] can serve as a virtual switch. In this case, both capacitive sensors 11, 12 are arranged in the region of the door frame, for example, and are oriented comparably to the bumper 102 in the trunk area 106 as above. Both of the capacitive sensors 11 and 12 can optionally also be arranged in the lower area of the side door, preferably below a stone guard. An approach of the object 80 toward the side door 101 can be detected by the first capacitive sensor 11 or by a proximity sensor for an access control system, which is generally arranged in the door handle.

Figure 2:
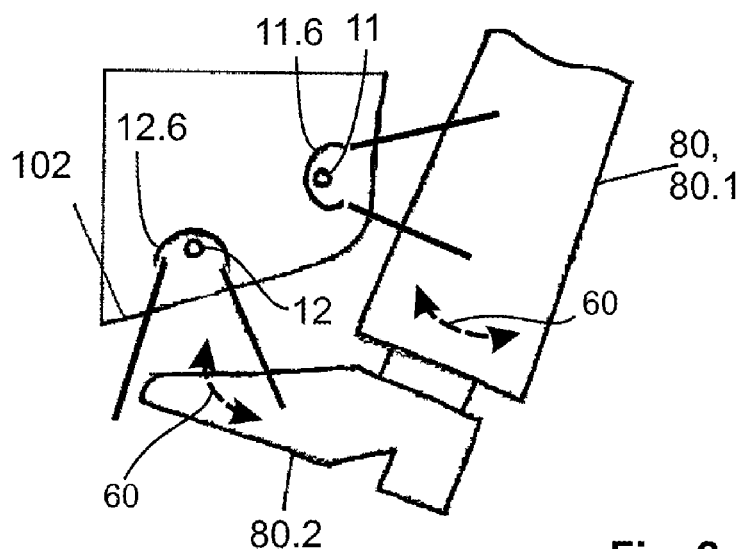
FIG. 2 shows a concrete embodiment for the actuation of the sensor system by a leg or a foot of a person.

A side view of a cutaway section of the rear bumper 102 and/or of the lower region of the side door 101 is shown in FIG. 2, wherein the capacitive sensors 11 and 12 are inserted in the same with their respective shields 11.6, 12.6. According to the illustration, a leg 80.1 of a person is partially shown, and projects into the first detection area 11b, the same running horizontally. In contrast, the foot 80.2 connected to the leg 80.1 projects into the detection area 12b which extends vertically beneath the rear bumper 102 and/or beneath the door frame area. The person 80 has approached the vehicle 100 in the region of the rear bumper 102 and/or the side door. As a result, the first capacitive sensor 11 can detect the proximity of the person 80 by means of the penetration of the leg 80.1 into the first detection area 11b. If the person signals the intention to actuate the moving part 101, by means of a back-and-forth movement of the foot 80.2 in the second detection area 12b, then a prespecified movement pattern 60 is created for the person. By means of the coupled detection of both the leg 80.1 and the foot 80.2, the actuation of the trunk hatch 101 and/or the side door 101 is initiated. The corresponding detection area 11b, 12b can be illuminated by means of an illumination and/or display means, the same not illustrated. The state of the moving part 101 on the sidewalk or the street next to the vehicle can also be displayed by a lettering. Upon the actuation, the electromechanical lock 103 is displaced in such a manner that it releases the moving part 101, whereby it can be changed over from a locked position into an open position. The opening and/or closing process can itself be performed mechanically by the adjusting mechanism 104 indicated in FIG. 1, the same likewise being activated by the actuation of the virtual switch and/or being detected by the sensor system 10.

Figure 3:
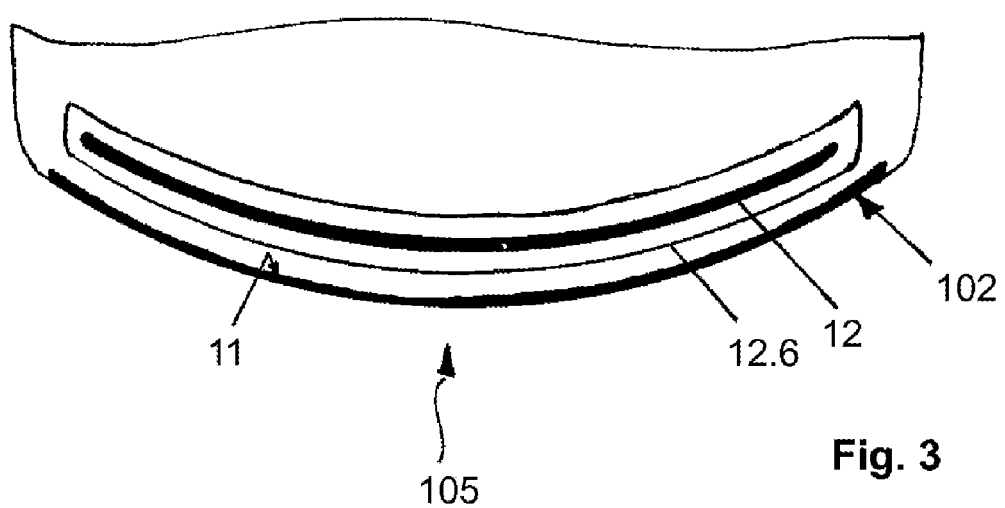
FIG. 3 shows a schematic top view of the arrangement of two sensors of the sensor system inside a rear bumper of a vehicle

FIG. 3 shows a top view of the arrangement of the sensors 11 and 12 inside the rear bumper 102 of the vehicle 100. The rear bumper 102 extends over the entire area of the vehicle hatch 105 of the vehicle 100, wherein the bumper 102 is shown in its entire width. According to the illustration, it can be seen that the sensors 11 and 12 can extend approximately over the entire width of the bumper 102. As a result, a person 80 can approach any position along the entire region of the hatch 105 of the vehicle 100, and execute the movement of the leg 80.1 as well as the foot 80.2 described in FIG. 2.

The illustration shows the arrangement of the first capacitive sensor 11 in the horizontal region of the bumper 102, whereas the second capacitive sensor 12 is indicated, along with the shield 12.6 which encloses the same, in the lower region of the bumper 102. The capacitive sensors 12 can be inserted or laid in the form of films or conductors into the bumper 102 along the width thereof. The capacitive sensors 11 and 12 are arranged along with their respective shields 11.6 12.6 inside the bumper 102.

Figure 4:
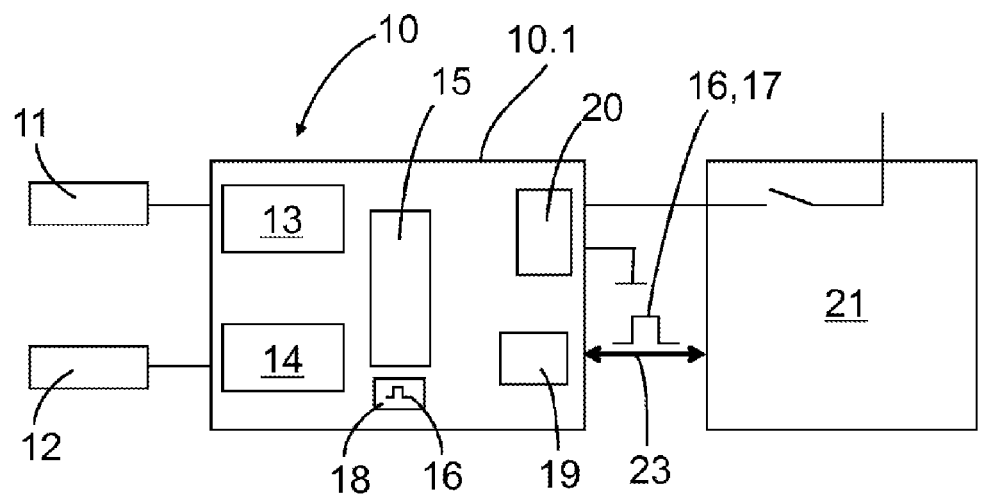
FIG. 4 shows a schematic illustration of the sensor system according to the invention, along with the connection to the external control module.

The sensor system 10 for the vehicle 100 is schematically illustrated in FIG. 4. In this case, both sensors 11, 12 are generally not arranged in the housing 10.1 for the sensor system 10 because they generally monitor the outer area of the vehicle 100. As such, each detection area 11b, 12b is oriented toward the outer area of the vehicle 100. In this case, the detection areas 11b, 12b can partially overlap or can be separate from each other. The control device 15 is connected to the sensor circuitry 13, 14 for the sensors 11, 12 inside the housing 10.1 of the sensor system. Both of the sensors 11, 12 can be connected to the control device 15 and/or the sensor circuitry 13, 14 by conductors or via a wireless connection. The sensor system 10 itself is supplied with electrical energy via the voltage supply 20 from the vehicle 100. In order to enable data communication between the sensor system 10 according to the invention and the external control module 21, the communication system 23 is included and is particularly designed as a LIN or CAN data bus. At this point it is hereby noted that further sensor systems 10 or external control modules 21 can of course be connected to the communication system 23. The answer signal 17, which comprises at least the most recent control signal 16, is relayed via the communication system 23. This last control signal 16 is saved in the storage device 18 provided for this purpose, and is passed on to the communication system 23 via the interface 19. In addition, the method according to the invention is saved in the sensor system 10 in order to improve operational reliability.

Figure 5:
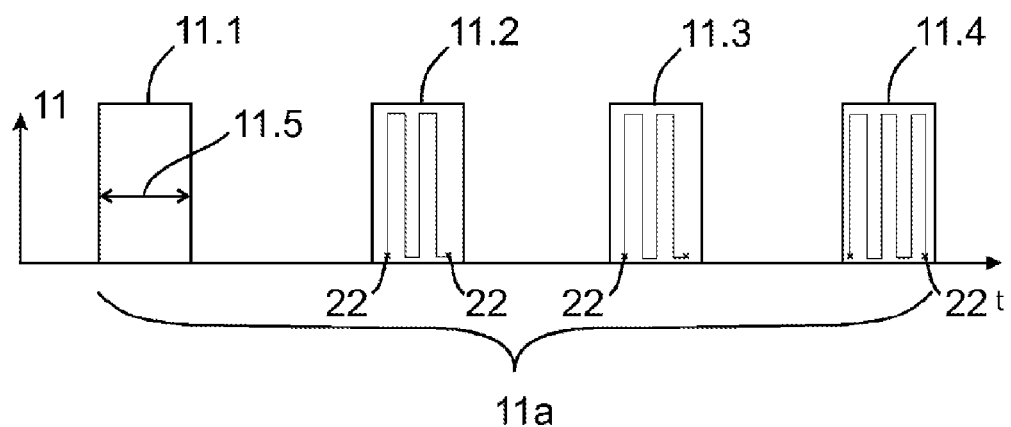
FIG. 5 shows a schematic illustration of the division of a complete measurement signal of the first sensor into multiple measurement steps, in a chronological diagram.
Figure 9:
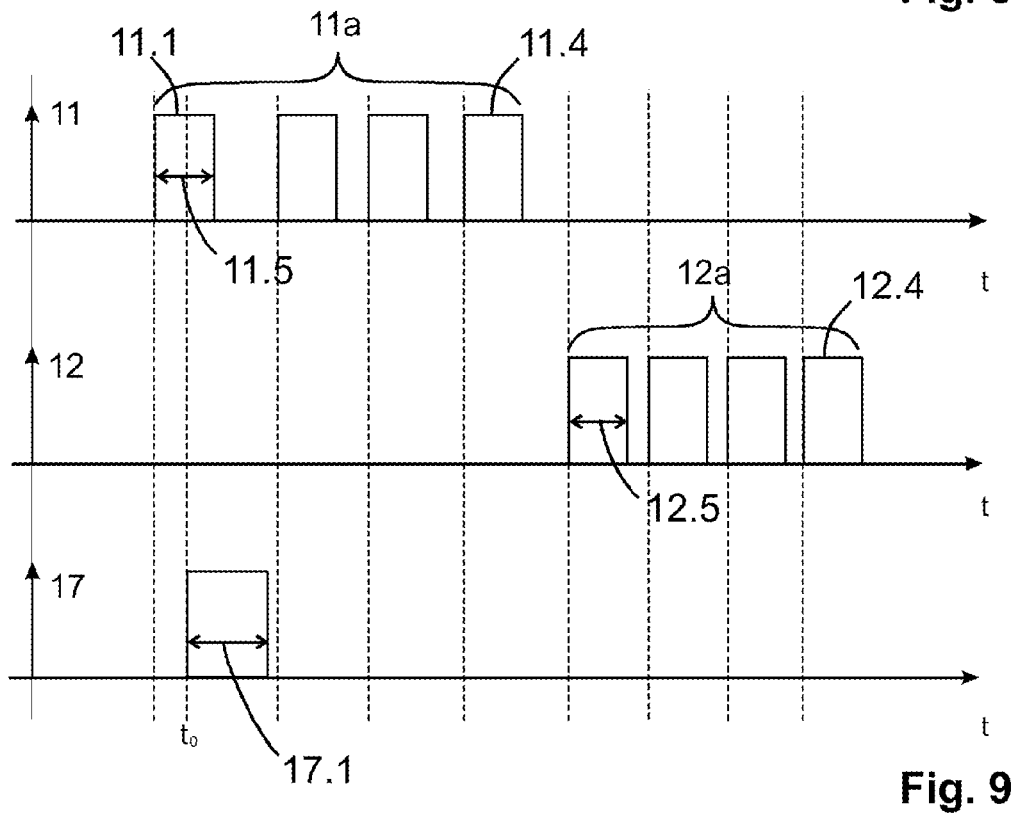
FIG. 9 shows a comparable process diagram to that in FIG. 8, having a request signal between the detection of the first measurement signal.

A chronological process diagram for the detection of the first measurement signal 11a by the sensor 11 is illustrated in an exemplary manner in FIG. 5. In this case, the first measurement signal 11a is dissected into a total of four individual measurement steps 11.1-4 which are carried out directly or indirectly (with short intermediate periods) chronologically one after the other. In this case, the complete measurement signal 11a is interrupted at predefined points 22 in order to end the measurement step 11.2, for example. The subsequent measurement step 11.3 then starts at the pre-specified point 22 at which the measurement of the measurement signal 11a is continued, until the next predefined point 22 follows. The measurement step 11.3 is ended by this next point 22. The complete measurement signal detection ends in the last measurement step 11.4, such that the complete measurement signal 11a is present at the control device 15. FIG. 5 only serves to explain how a measurement signal 11a is divided into individual measurement steps 11.1-4. Of course, fewer or more measurement steps can also be carried out in this case. The time span 11.5 of a measurement step 11.1 must be reasonably chosen as smaller than a time span 17.1 of the answer signal 17 for the external control module 21. This is clarified in greater detail in FIGS. 7 and 9.

Figure 6:
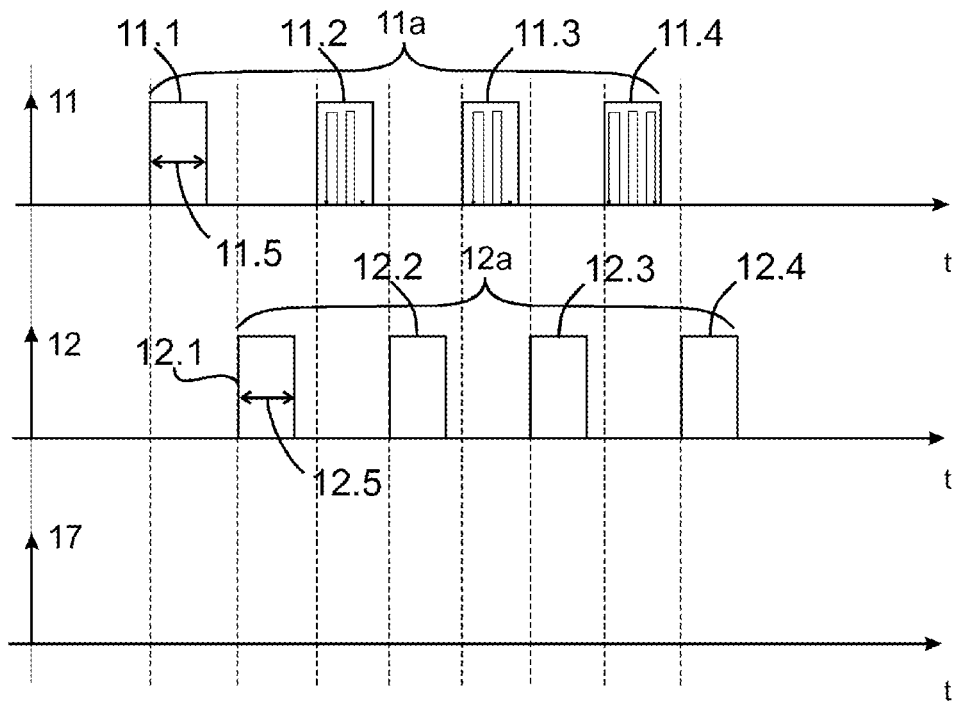
FIG. 6 shows a chronological process diagram for the individual measurement signals of the sensors, without a request signal of the external control module.

A chronological process diagram for the two sensors 11, 12, as well as a possible answer signal 17, are illustrated in FIG. 6. In any case, no request signal is present from the external control module 21, such that the control device 15 in fact does not need to transmit an answer signal 17. As can also be seen in FIG. 6, both measurement signals 11a, 12a are divided into multiple measurement steps 11.1-4, 12.1-4. After the first measurement step 11.1 has been detected by the control device 15, the next measurement step 12.1 of the following sensor 12 is detected. As such, the measurement steps of the individual sensors 11, 12 are queried in alternation by the control device 15. During the intermediate time period between the ending of the measurement step 11.1 and the start of the measurement step 12.1, the control device 15 queries the interface 19 for a request signal. If this request signal is not present, then the control device 15 detects the following measurement step.

Figure 7:
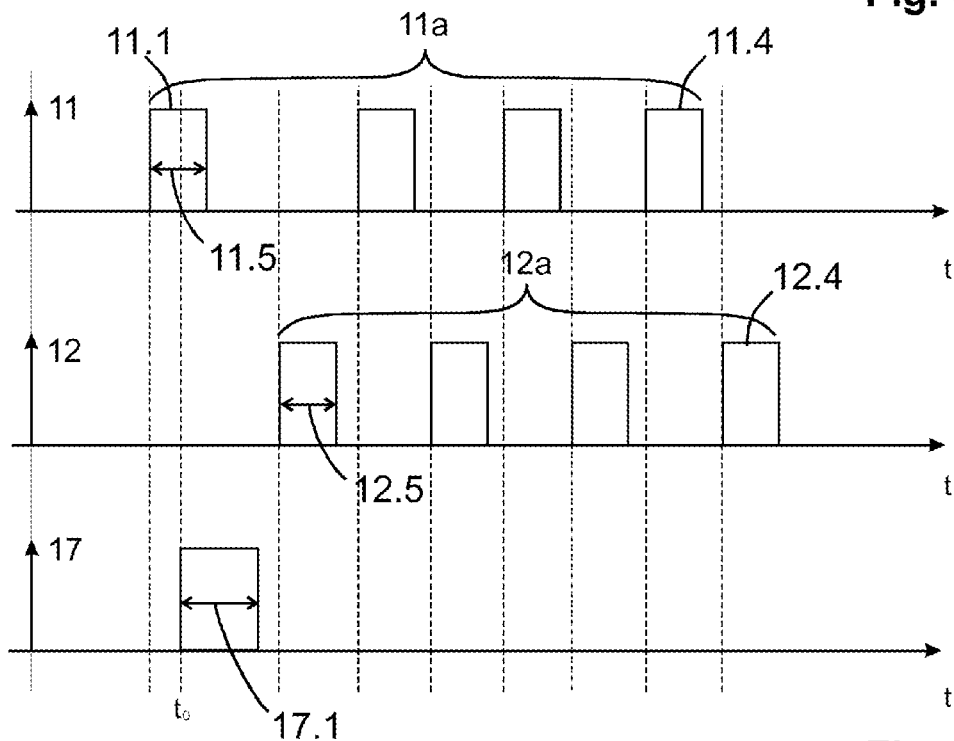
FIG. 7 shows a comparable process diagram to that in FIG. 7, but with a request signal of the external control module.

In contrast to FIG. 6, an alternating query process of the measurement steps by the sensors 11, 12 is illustrated in FIG. 7; in any case, a request signal, for example, is present in this case at time point t0 during the first measurement step 11.1. Following the end of this measurement step 11.1, the control device 15 then queries the interface 19 for a request signal in the intermediate time period. Because the request signal is present, the control device 15 immediately transmits the answer signal 17 via the interface 19 to the external module 21. The external module 21 allows the sensor system 10 the time span 17.1 for the answer signal 17. This time span 17.1 starts with the transmission of the request signal to the sensor system 10. As is clearly recognizable in FIG. 7, the further measurement steps 11.2-4, 12.1-4 are delayed by the sensors 11, 12 until the answer signal 17 has been sent to the external control module 21.

Figure 8:
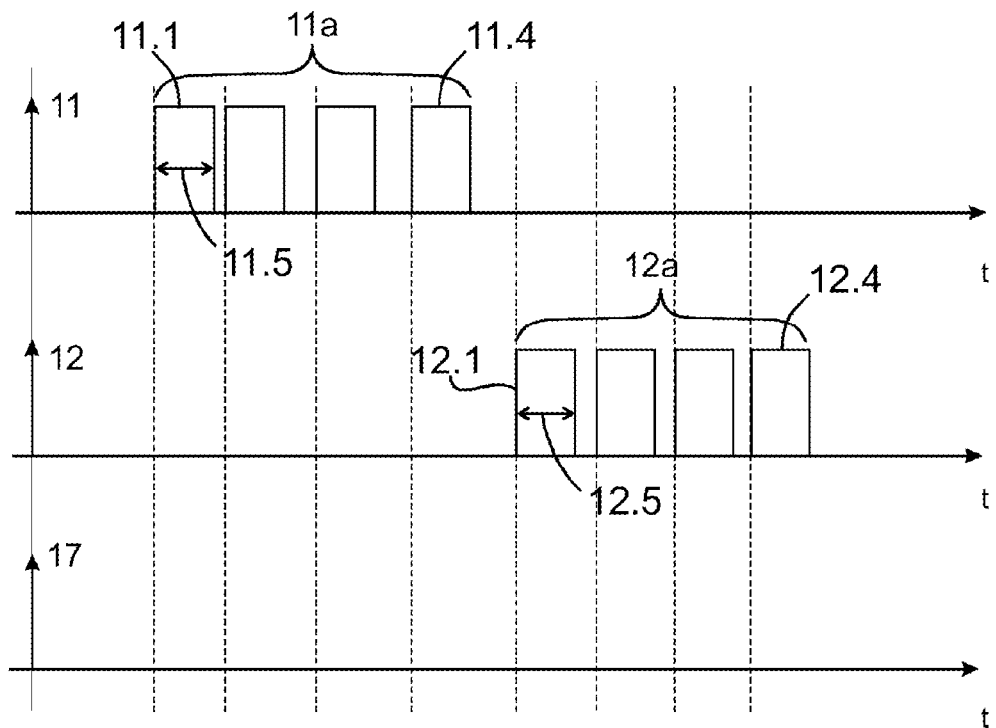
FIG. 8 shows a comparable process diagram to that in FIG. 6, wherein the individual measurement steps of the sensors are detected in sequence, without a request signal of the external control module being present.

A variant of the process flow in FIG. 6 is illustrated in FIG. 8. In this case, the individual measurement steps 11.1-4, 12.1-4 are not queried in alternation by sensor 11 to sensor 12; rather, the measurement signal 11a is detected in sequence by means of the measurement steps 11.1-4. Only once the measurement signal 11a is present in its entirety does the control device 15 begin to detect the measurement signal 12a of the further sensor 12 by means of the individual measurement steps 12.1-4. In FIG. 8—just as in FIG. 6—there is no request signal present from the external control module 21.

In contrast to FIG. 8, the external control module 21 transmits a request signal during the first measurement step 11.1 to the sensor system 10, particularly to the interface 19. As in FIG. 7 as well, the control device 15 detects this request signal from the interface 19, the same having been transmitted by the external control module 21 at time point t0, but only actually detects the same after the ending of the first measurement step 11.1 by the control device 15. The control device [15] then transmits the answer signal 17 to the external control module 21 via the interface, and particularly within the allowed time span 17.1. Because the time span 17.1 is larger than the individual time spans 11.5, 12.5 of the measurement steps 11.1-4, 12.1-4, as in FIG. 9 as well, it is ensured that the external control module 21 receives an answer signal 17 sufficiently quickly in every case. In this case, it should be clearly noted once again that the answer signal 17 has at least the most recent saved control signal 16 which was present at the control device 15. As can further be seen in FIG. 9, the further measurement steps 11.2-4 of the first sensor 11, as well as the following measurement steps 12.1-4 from the second sensor 12 are delayed as a result of the first transmitted answer signal 17. Subsequently, the method according to the invention can be restarted, wherein a new control signal 16 is generated from the most recent complete measurement signal 11a, 12a, and the new control signal [16] can be saved in the storage device 18.

Finally, it is hereby noted once again that multiple sensors can also be incorporated in the sensor system 10 by means of the method according to the invention. The individual time spans 11.5, 12.5 of the measurement steps can also vary, wherein it is nevertheless reasonable for these to not exceed the time span of the answer signal 17.

The invention claimed is:

1. A method for controlling a sensor system for a vehicle, having
   at least one or two sensors which each comprise detection areas, and detect changes in these detection areas by means of measurement, and relay these changes as measurement signals, having a control device, which can be designed in the form of a microprocessor and includes only one microprocessor and which is connected to the sensors, the sensors being configured as capacitive sensors, wherein the control device evaluates each measurement signal and generates at least one control signal therefrom, having at least one storage device in which at least the most recent control signal is saved, and having an interface by means of which the control device relays at least the most recent control signal to an external control module to control the operation of a vehicle device,
   wherein at least one measurement signal of a sensor is detected in multiple measurement steps by the control device, and in that the control device transmits at least the most recent control signal to the external control module via the interface, between the individual measurement steps,
   wherein the control device checks whether a request signal of the external control module for an answer signal is present at the interface following one or each measurement step,
   wherein a time span for a measurement step is smaller than a pre-specified answer time span of the external control module.

2. A method according to claim 1, wherein each measurement signal of the sensors is divided into individual measurement steps which are detected by the control device.

3. A method according to claim 1, wherein individual measurement steps of the respective sensors are always detected by the control device in a pre-defined sequence, such that the control device queries the sensors in this sequence.

4. A method according to claim 1, wherein a measurement step is ended at a defined point of the measurement signal.

5. A method according to claim 4, wherein a measurement step is ended at a defined point of the measurement signal, and the evaluation is continued during the following measurement step at this defined point.

6. A method according to claim 1, wherein a time span of the measurement step is the same length for all sensors.

7. A method according to claim 1, wherein the control device generates a measurement signal from the individual measurement steps of a sensor once all measurement steps have been carried out for this purpose, and in that at least one control signal is generated by the control device from the complete measurement signals, and is transferred to the external control module, into the storage device, as the most recent control signal for an answer signal.

8. A method according to claim 1, wherein the control device can always only query and/or detect one actuator in the form of the sensors, or the interface at any one time.

9. A method according to claim 1, wherein a bi-directional data transmission occurs with the external control module via the interface.

10. A method according to claim 9, wherein the data transmission is a serial data transmission.

11. A method according to claim 1, wherein the interface of the control device relays the control signal as an answer signal to a communication system.

12. A method according to claim 11, wherein the interface of the control device relays the control signal as an answer signal to a so-called local interconnect network (LIN bus) or to a controller area network (CAN bus).

13. A method according to claim 1, wherein the interface of the control device relays the control signal as an answer signal to a serial communication system.

\* \* \* \* \*